(12) United States Patent
Offord

(10) Patent No.: US 6,198,323 B1
(45) Date of Patent: Mar. 6, 2001

(54) FLIP-FLOP HAVING GATED INVERTER FEEDBACK STRUCTURE WITH EMBEDDED PRESET/CLEAR LOGIC

(75) Inventor: Glen E. Offord, Macungie, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/238,793

(22) Filed: Jan. 28, 1999

(51) Int. Cl.[7] .................................................. H03K 3/289
(52) U.S. Cl. .......................... 327/202; 327/199; 327/203
(58) Field of Search .................................. 327/217, 203, 327/202, 199, 208, 209, 210

(56) References Cited

U.S. PATENT DOCUMENTS

| 4,114,049 | 9/1978 | Suzuki | 327/212 |
|---|---|---|---|
| 4,733,111 | 3/1988 | Fassino et al. | 327/202 |
| 5,400,295 | 3/1995 | Matsumura et al. | 365/233 |
| 5,463,340 | 10/1995 | Takaatake et al. | 327/211 |
| 5,663,669 | 9/1997 | Vanderschaaf | 327/201 |
| 5,767,716 | 6/1998 | Ko | 327/203 |

FOREIGN PATENT DOCUMENTS

| 60-096914 | 5/1985 | (JP) . | |
|---|---|---|---|
| 61-101113 | 5/1986 | (JP) . | |
| 362095017 | * 7/1989 | (JP) | 327/203 |
| 403049412 | * 7/1989 | (JP) | 327/217 |

OTHER PUBLICATIONS

"Clocked CMOS Calculator Circuitry", by Y. Suzuki et al., IEEE Journal of Solid–State Circuits, US, IEEE Inc., New York, vol. SC–8, No. 6, Dec. 1, 1973, p. 64, XP002064533, ISSN: 0018–9200.

* cited by examiner

Primary Examiner—Toan Tran
Assistant Examiner—Hiep Nguyen
(74) Attorney, Agent, or Firm—Steve Mendelsohn

(57) ABSTRACT

A flip-flop having one or more stages (e.g., a master stage and a slave stage in a master-slave flip-flop, or a single stage as in a latch), at least one stage having a driver coupled at its input and output to a feedback path with a gated inverter having embedded preset and/or clear logic. By embedding the preset/clear logic in the feedback path, the driver can be implemented using a simple inverter. Moreover, the preset and/or clear functionality can be added without adversely affecting either the setup time or the clock-to-Q propagation time of the flip-flop.

20 Claims, 3 Drawing Sheets

FLIP-FLOP HAVING GATED INVERTER FEEDBACK STRUCTURE WITH EMBEDDED PRESET/CLEAR LOGIC

BACKGROUND OF THE INVENTION

1. Field of the Invention

The present invention relates to electrical circuits, and, in particular, to edge-triggered flip-flops, such as master-slave flip-flops, and level-sense flip-flops, often called latches.

2. Description of the Related Art

A master-slave flip-flop is an electrical device that temporarily stores data, where the data is transferred into and within the device on the edges of clocking signals. The master stage of such a flip-flop stores data received at an input port D during one phase of a two-phase clock. On the opposite phase of the two-phase clock, the slave stage stores the data received from the master stage and presents that stored data at an output port Q of the master-slave flip-flop.

FIG. 1 shows a schematic drawing of a prior-art implementation of a static master-slave flip-flop 100 that relies on switched feedback techniques to retain data. Flip-flop 100 comprises four switches S1–S4 and four drivers D1–D4 (implemented using inverters INV1–INV4, respectively) arranged and operated to move data through flip-flop 100 in a particular manner. Flip-flop 100 has a master stage, consisting of switches S1 and S2 and inverters INV1 and INV2, and a slave stage, consisting of switches S3 and S4 and inverters INV3 and INV4.

The master and slave sections of flip-flop 100 each provide memory. This is achieved by feeding back a signal from the output of each stage to its input, thereby holding the output at its present value. If the driver in each stage is inverting, then the feedback path in each stage must also be inverting to provide this memory property.

Switches S1–S4 are controlled by the levels of a two-phase clock, such that switches S1 and S4 are opened when switches S2 and S3 are closed, and vice versa. When switches S1 and S4 are closed and switches S2 and S3 are open, the master stage receives a data signal from input node D. When switches S1 and S4 are open and switches S2 and S3 are closed, data stored in the master stage is passed to the slave stage and output Q. When switches S1 and S4 are closed again and switches S2 and S3 are opened again, the data received by the slave stage from the master stage is stored in the slave stage and held at output Q, while the master stage receives a new data signal at input D. In this way, master-slave flip-flop 100 temporarily stores data received from an input data stream.

As described, with switch S2 closed and switch S1 open, the master stage of flip-flop 100 functions as a memory element. Switches S1 and S2 are typically transmission gates. The classic CMOS transmission gate is constructed of an N channel transistor and a P channel transistor, where the sources of these two devices are tied together and the drains of these devices are also tied together. When the P and N devices are both on, a low resistance path from source to drain is achieved. Alternately, if the P and N devices are turned off, the switch is considered open. Such a transmission gate is a non-inverting structure.

Flip-flops such as flip-flop 100 of FIG. 1 have certain disadvantages. In particular, the most basic design requires four switches and four inverters, which utilize substantial layout area as well as power.

FIG. 2 shows a schematic drawing of a prior-art implementation of a static master-slave flip-flop 200 that relies on weak feedback techniques to retain data. In flip-flop 200, inverters INV2 and INV4 are weak inverters that are designed to have a very small drive. As such, inverter INV2 can be overdriven easily when switch S1 is closed, and inverter INV4 can be overdriven easily when switch S3 is closed, but inverters INV2 and INV4 will provide enough positive feedback during standby (i.e., when switches S1 and S3, respectively, are opened) to retain information in the flip-flop. Because inverters INV2 and INV4 have very small drives, flip-flop 200 can be designed without switches (such as switches S2 and S4 of FIG. 1) in the feedback paths of the master and slave stages, since the input signals received at nodes I1 and I3 from nodes D and I2, respectively, will be sufficiently large to control the state of inverters INV1 and INV3, no matter what signals are received from weak inverters INV2 and INV4, respectively.

Flip-flop 200 has certain advantages over flip-flop 100 of FIG. 1. First of all, flip-flop 200 has two fewer switches than flip-flop 100. Moreover, flip-flop 200 replaces two of the strong inverters of flip-flop 100 with two weak inverters. As such, flip-flop 200 can be implemented with a smaller layout area.

Another desirable goal (in addition to smaller area) in designing flip-flops is to keep both setup time and clock-to-Q propagation time as short as possible. Setup time refers to the time that it takes to charge the master stage of the flip-flop. Analogously, clock-to-Q propagation time refers to the time that it takes to charge the slave stage of the flip-flop. Referring to FIGS. 1 and 2, setup time is the minimum amount of time that the input value D needs to be applied to the master stage before the master transmission gate S1 is opened and still have the master stage retain the correct input value. Clock-to-Q propagation time is the amount of time between the clock edge that closes slave transmission gate S3 and the correct data value reaching output Q.

It is often desirable to implement a flip-flop with preset and/or clear functionality. A preset condition configures the flip-flop to have an output value Q of 1, while a clear condition configures the flip-flop to have an output value Q of 0. FIGS. 3–5 show three different prior-art implementations of static master-slave flip-flops having logic added to support both preset and clear functionality.

FIG. 3A shows a static feedback flip-flop 300 with transmission gate switches in the master and slave feedback loops, similar to flip-flop 100 of FIG. 1. In flip-flop 300, drivers D1 and D4 are both implemented using a gate structure with OR and NAND gate functionality, with preset signal PD and clear signal CDN applied to those drivers to achieve the desired flip-flop preset and clear functionalities. FIGS. 3B and 3C show how the clock signal CKN and the preset signal PD are generated from the input clock signal CK and the input preset signal PDN, respectively.

Referring again to FIG. 3A, the setup time for flip-flop 300 is proportional to the capacitance at node i1. Similarly, the clock-to-Q propagation time for flip-flop 300 is proportional to the capacitance at node i3. In general, the lower the capacitances at nodes i1 and i3, the lower the setup time and clock-to-Q propagation time, respectively. One of the disadvantages of the design of flip-flop 300 is that the implementation of driver D1 as a relatively complex gate structure with applied preset and clear signals greatly increases the effective capacitance at node i1 for a given drive capability of driver D1 (as compared with using an inverter for driver D1), thereby greatly increasing the setup time for flip-flop 300. Moreover, the use of gate structures for drivers D1 and D4 increases the layout size for flip-flop 300, relative to a flip-flop implemented using simple inverters for drivers.

FIG. 4A shows a static weak-keeper feedback flip-flop 400, similar to flip-flop 200 of FIG. 2. As was the case with flip-flop 200, using weak keepers in the feedback paths of flip-flop 400 eliminates the need for feedback switches (e.g., switches S2 and S4 in FIG. 1) and allows all four drivers to be implemented using simple inverters, thereby decreasing the layout of flip-flop 400 relative to flip-flop 300 of FIG. 3. FIG. 4B shows how the clock signals CKX and CKY are generated from the input clock signal CK, the input preset signal PDN, and the input clear signal CDN. Similarly, FIGS. 4C and 4D show how the clear signal CD and the preset signal PD are generated from the input clear signal CDN and the input preset signal PDN, respectively.

In flip-flop 400, the feedback loop in the slave stage is implemented separate from output driver D3 in order to limit feedback contention time and protect the flip-flop state from external changes to Q. Feedback contention refers to the tendency of an ungated feedback loop to resist changes in signal level (even when the feedback driver is a weak keeper as in flip-flop 400) due to the time that it takes for the signal to propagate through the feedback path, thereby increasing the time that it takes to change the signal level at the feedback-loop input node (in this case, node i3).

Unfortunately, the existence of feedback contention in the ungated master feedback loop does adversely affect the setup time of flip-flop 400. Moreover, the presence of preset and clear devices tied directly to nodes i1 and i3 in flip-flop 400 further increases the capacitances at nodes i1 and i3, thereby increasing both setup time and clock-to-Q propagation time. In addition, the application of present and clear signals in the clocking scheme of FIG. 4B further increases clock-to-Q propagation time for flip-flop 400.

FIG. 5A shows static feedback flip-flop 500, which is a hybrid of the flip-flops of FIGS. 3 and 4. FIG. 5B shows how the clock signals CKN and CKA are generated from the input clock signal CK, and FIG. 5C shows how the preset signal PD is generated from the input preset signal PDN. As a hybrid, flip-flop 500 has a master stage, similar to that of flip-flop 300 of FIG. 3, with gated feedback and a complex gate transmission driver with preset and clear inputs, and a slave stage, similar to that of flip-flop 400 of FIG. 4, with preset and clear devices tied directly to node i3 and a feedback loop separate from the output transmission driver. As such, flip-flop 500 has capacitance problems, at node i1, similar to those in the master stage of flip-flop 300 and, at node i3, similar to those in the slave stage of flip-flop 400, which will increase setup time and clock-to-Q propagation time, respectively. Feedback contention in the master stage of flip-flop 500 will also adversely affect setup time.

In the master stage of flip-flop 500, the feedback path has an inverter (e.g., D2 of FIG. 1) combined with a switch (e.g., S2 in FIG. 1) into a gated inverter configuration. In flip-flop 500, the gated inverter structure comprises P channel devices MP1 and MP2 and N channel devices MN1 and MN2, where the MP1 and MN1 devices provide the inverter function, and the MP2 and MN2 devices provide the gating function. When clock signal CKA is 1 and clock signal CKN is 0, the gate is open and node i1 is isolated from the driver output (i.e., node i2).

In the gated inverter structure in the master stage of flip-flop 500, the sources of the devices that perform the gating function are not connected to each other and the drains of those devices are also not connected to each other, as in the typical transmission gate described earlier with reference to flip-flop 100 of FIG. 1. Note that the inverter and gating functions may be reversed such that MP1 and MN1 provide the gating function and MP2 and MN2 provide the inverter function. In this case, either the sources of the devices that form the gating function will be connected to each other or the drains of those devices will be connected to each other, but not both the sources and the drains.

SUMMARY OF THE INVENTION

The present invention is directed to edge-triggered flip-flops (such as master-slave flip-flops) and level-sense flip-flops (often called latches) that are configured to support either a preset function, a clear function, or both. In a typical implementation of the present invention, the addition of preset and/or clear logic contributes little or no capacitance at the feedback-loop input nodes, thereby limiting or even negating the adverse effects to setup time and/or clock-to-Q propagation time that typically result from the addition such preset/clear functionality to a static flip-flop.

According to one embodiment, the present invention is an integrated circuit having a flip-flop, the flip-flop comprising one or more stages, at least one stage having a transmission gate coupled to an input of a driver and a feedback path coupling an output of the driver to the input of the driver. The feedback path comprises a gated inverter with either embedded preset logic or embedded clear logic or both. The gated inverter comprises at least two devices that perform a gating function, and the devices that perform the gating function are not connected to each other at both their sources and their drains.

For example, the flip-flop may be a master-slave flip-flop, comprising (a) a master stage having a master transmission gate connected to a master driver with a master feedback path; and (b) a slave stage connected to the master state, the slave stage having a slave transmission gate connected to a slave driver with a slave feedback path, wherein either the master feedback path or the slave feedback path or both have gated inverter structures with either embedded preset logic or embedded clear logic or both.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 6A:
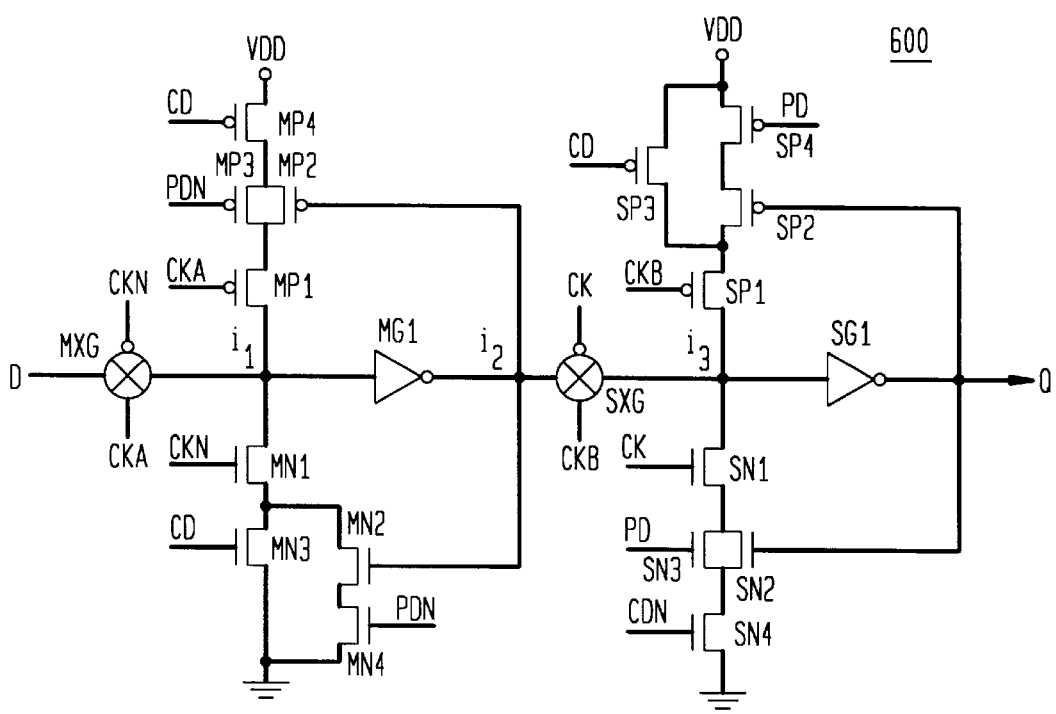
FIG. 6A shows a static flip-flop, according to one embodiment of the present invention.
Figure 6B:
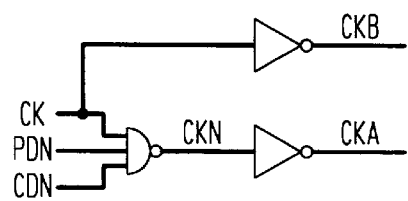
FIG. 6B shows how clock signals CKN, CKA, and CKB are generated from input clock signal CK, for the flip-flop of FIG. 6A.
Figure 6C:
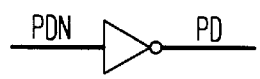
FIGS. 6C and 6D show how preset signal PD and clear signal CD are generated from input preset signal PDN and input clear signal CDN, respectively, for the flip-flop of FIG. 6A.
Figure 6D:
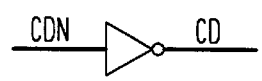

FIG. 6A shows a static flip-flop 600, according to one embodiment of the present invention. Flip-flop 600 is a data-input-style (i.e. D-style), asynchronous preset and clear static flip-flop. The operation of flip-flop 600 is controlled by externally generated clock signal CK, internally generated clock signals CKN, CKA, and CKB, externally generated preset signal PDN, internally generated preset signal PD, externally generated clear signal CDN, and internally generated clear signal CD. FIG. 6B shows how clock signals CKN, CKA, and CKB are generated from input clock signal CK, input preset signal PDN, and input clear signal CDN. Similarly, FIGS. 6C and 6D show how preset signal PD and clear signal CD are generated from input preset signal PDN and input clear signal CDN, respectively.

Referring again to FIG. 6A, flip-flop 600 comprises master transmission gate MXG, master transmission driver MG1, slave transmission gate SXG, and slave transmission driver SG1, where drivers MG1 and SG1 are implemented using simple inverters. In addition, the master and slave stages of flip-flop 600 each have a feedback path having a gated inverter structure with embedded preset and clear logic configured to provide preset and clear functionality to the flip-flop. In this specification, the term "embedded" implies that the preset and/or clear logic is part of the gated inverter feedback path; it does not necessarily imply that the preset and/or clear logic is part of the same integrated circuit as the corresponding gated inverter structure, although that may be true for certain implementations of the present invention.

In the master stage, the gated inverter structure in the master feedback path comprises (a) an inverter function implemented by devices MP2 and MN2 and (b) a clocked feedback gating function implemented by devices MP1 and MN1, where both the source and the drain of MP1 are not connected, respectively, to both the source and the drain of MN1. Embedded in the master feedback path are preset devices MP3 and MN4 and clear devices MP4 and MN3. Similarly, in the slave stage, the gated inverter structure in the slave feedback path comprises (a) an inverter function implemented by devices SP2 and SN2 and (b) a clocked feedback gating function implemented by devices SP1 and SN1, where both the source and the drain of SP1 are not connected, respectively, to both the source and the drain of SN1. Embedded in the slave feedback path are preset devices SP4 and SN3 and clear devices SP3 and SN4.

Devices MP1–MP4, MN1–MN4, SP1–SP4, and SN1–SN4 are preferably implemented using minimum-sized P and N channel transistors having minimum capacitances for the particular technology, although other suitable types of devices are also possible, such as in a bipolar design.

Figure 1:
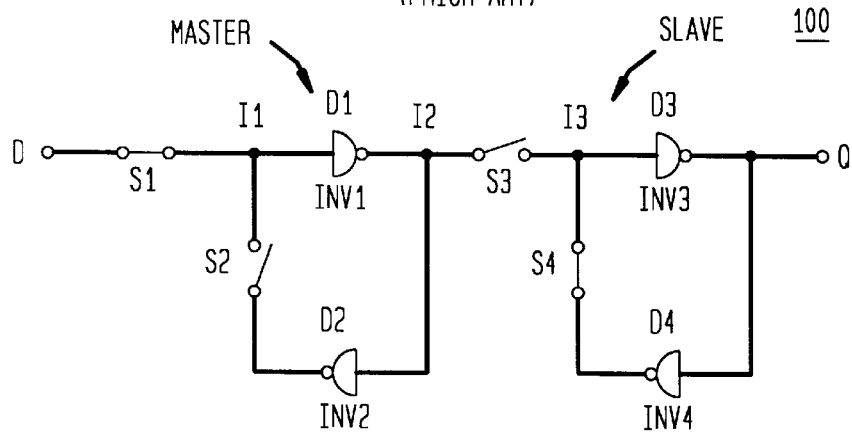
FIG. 1 shows a schematic drawing of a prior-art implementation of a static master-slave flip-flop that relies on switched feedback techniques to retain data.
Figure 2:
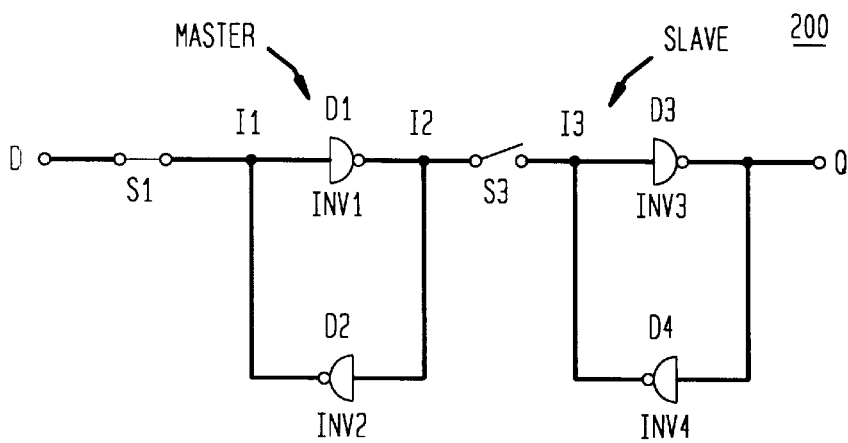
FIG. 2 shows a schematic drawing of a prior-art implementation of a static master-slave flip-flop that relies on weak feedback techniques to retain data.
Figure 3A:
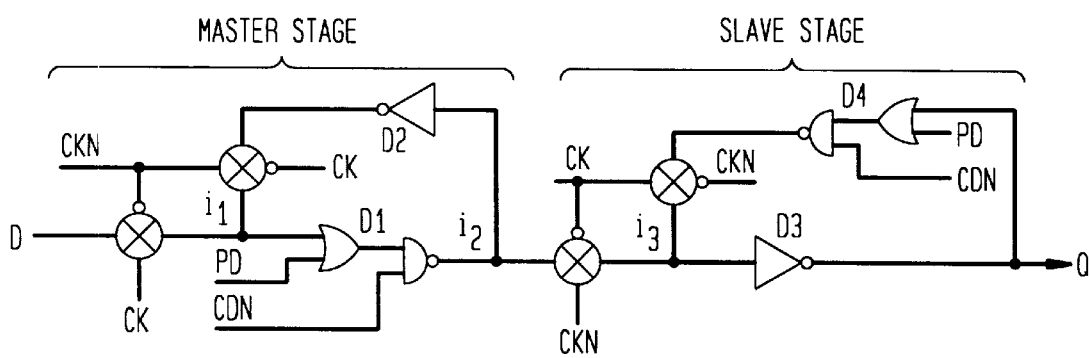
FIG. 3A shows a static feedback flip-flop with transmission gate switches in the master and slave feedback loops, similar to the flip-flop of FIG. 1, designed to support preset and clear functionalities.
Figure 3B:
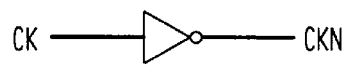
FIGS. 3B and 3C show how the clock signal CKN and the preset signal PD are generated from the input clock signal CK and the input preset signal PDN, respectively, for the flip-flop of FIG. 3A.
Figure 3C:
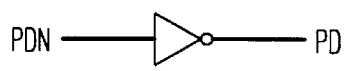
Figure 4A:
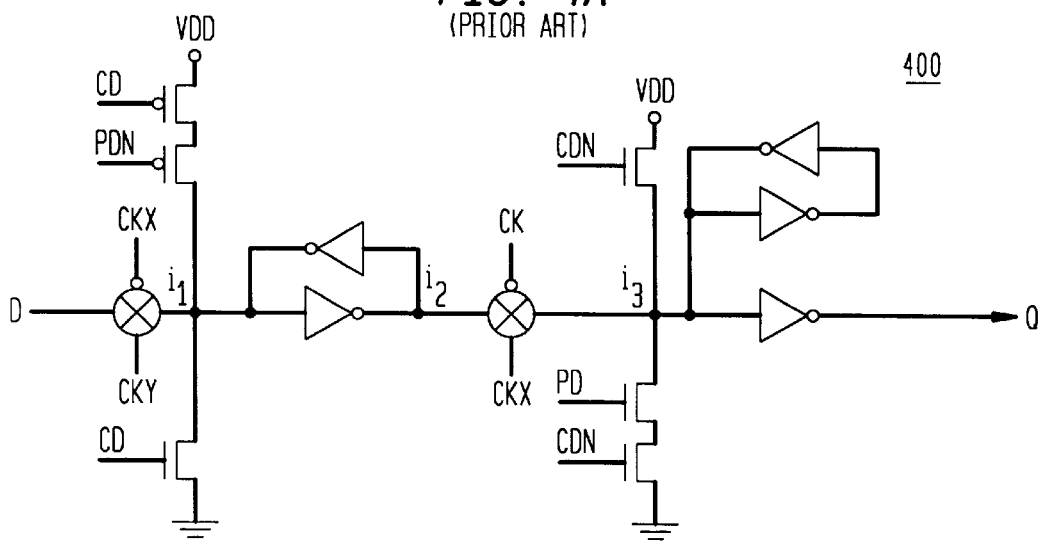
FIG. 4A shows a static weak-keeper feedback flip-flop, similar to the flip-flop of FIG. 2, designed to support preset and clear functionalities.
Figure 4B:
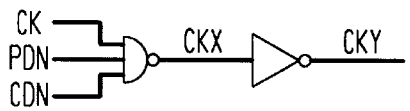
FIG. 4B shows how the clock signals CKX and CKY are generated from the input clock signal CK, the input preset signal PDN, and the input clear signal CDN, for the flip-flop of FIG. 4A.
Figure 4C:
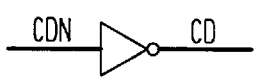
FIGS. 4C and 4D show how the clear signal CD and the preset signal PD are generated from the input clear signal CDN and the input preset signal PDN, respectively, for the flip-flop of FIG. 4A.
Figure 4D:
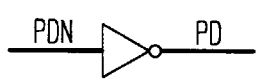
Figure 5A:
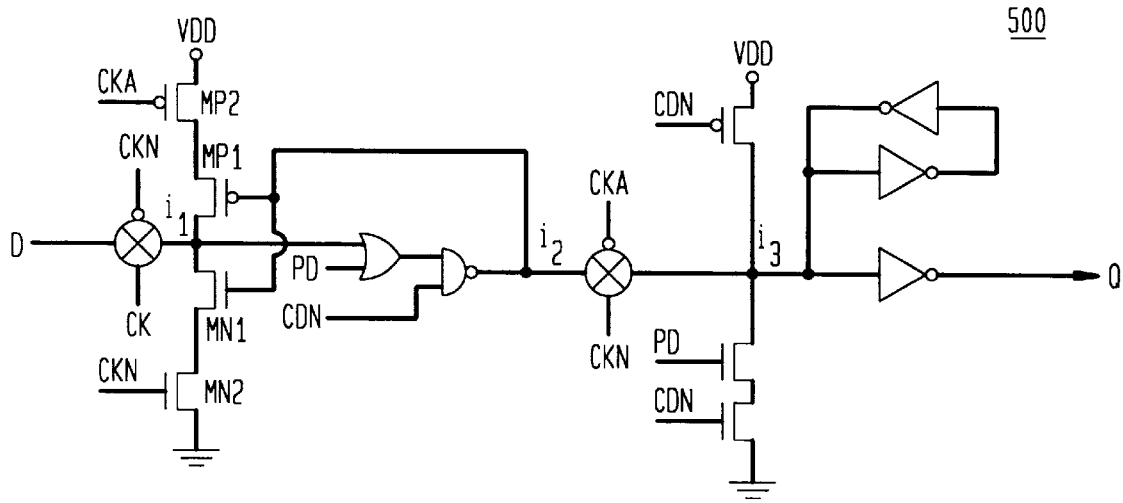
FIG. 5A shows a static feedback flip-flop, which is a hybrid of the flip-flops of FIGS. 3 and 4.
Figure 5B:
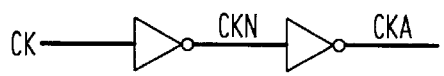
FIG. 5B shows how the clock signals CKN and CKA are generated from the input clock signal CK.
Figure 5C:
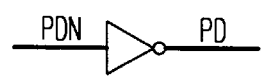
FIG. 5C shows how the preset signal PD is generated from the input preset signal PDN, for the flip-flop of FIG. 5A.

In this particular embodiment, preset and clear functionality has been added to the gated inverter feedback structures of the flip-flop in a manner so as not to present significant additional loading of the data propagation path as compared to typical prior-art techniques (e.g., FIGS. 3–5). This minimum-loading arrangement allows optimum speed performance both in setup time and clock-to-Q propagation time. Additionally, since neither the preset nor the clear functionality affects the capacitance of the critical data path, different preset/clear-type flip-flops can be exchanged in a design without affecting timing performance. This means that a circuit can be designed with one or more flip-flops based on the general configuration of flip-flop 600 without concern for whether any particular flip-flop is implemented with or without preset and/or clear functionality.

Clock signals CKN and CKA are used to control the master stage of flip-flop 600, while clock signals CK and CKB control the slave stage, where clock signal CKB is independent of the preset and clear signals, as shown in FIG. 6B. This clocking scheme for flip-flop 600 frees the slave stage from the gated clocking (for preset/clear) of the master stage. This allows additional reduction in the clock-to-Q propagation time. An added benefit is the reduction and even avoidance of feedback contention when presetting or clearing the flip-flops. The present invention enables minimum-size devices to be used for the completely asynchronous feedback paths of both master and slave stages thereby enabling a smaller design and providing a reduction in any contention noise.

As described earlier, an important aspect of speed performance is minimizing the contributions to the capacitances at nodes i1, i2, and i3 due to the feedback and preset/clear functionality. By placing the preset and clear logic (consisting of devices MP3,4, MN3,4, SP3,4, and SN3,4) in the gated inverter feedback paths made up of MN1,2 and MP1,2 of the master stage and SN1,2 and SP1,2 of the slave stage, the preset/clear functionality does not affect the speed path. All devices in the feedback sections are preferably minimum size, which is desirable for considerations of both performance and layout.

Setup time is a function of how fast node i1 can be made to follow the input D. The master transmission gate MXG of flip-flop 600 has, as its load, inverter MG1 and devices MP1 and MN1, both of which are minimum-size devices. Flip-flop 500 of FIG. 5 employs a gated inverter feedback path without embedded preset/clear, and requires a complex gate structure for the master transmission driver. To achieve equivalent clock-to-Q performance, the gate structure of flip-flop 500 would have to be larger than inverter MG1 of flip-flop 600 and would present a larger load to node i1, thereby adversely affecting setup time. Similarly, tying preset and clear devices directly to node i1, as in flip-flop 400 of FIG. 4, adds capacitance and typically requires larger-than-minimum-size devices, again resulting in increased setup time.

Clock-to-Q propagation time is a function of drivers MG1 and SG1, gate SXG, as well as the capacitances of nodes i2, i3, and Q. In flip-flop 600, driver MG1 is an inverter, which will have better drive than the gate structure of flip-flop 500 for a given i1 load. The feedback loading of node i2 consists of two minimum-size devices which provide minimum capacitance loading. Additionally, driver MG1 drives less capacitance at the i3 node than flip-flop 500, which has loading from four additional transistors due to a back-to-back inverter latch and preset/clear functionality. Additionally, the back-to-back inverters in the slave stage of flip-flops 400 and 500 have some feedback contention that opposes any clock-to-Q change until they flip state.

Flip-flop 600 does not require gated clocking for the slave stage. Gate SXG and devices SP1 and SN1 are controlled with clock signals CK and CKB, which will be an inverter faster than using clock signals CKN and CKA as in flip-flop 500 and significantly faster than using CK and CKX in flip-flop 400. The use of preset and/or clear in the feedback path naturally accounts for a clock state that precludes having to force gate SXG off prior to preset or clear. In general, for the present invention, if gate SXG is on (with devices SP1 and SN1 both off), the preset/clear functionality will be generated from the master flip-flop logic. If gate SXG is off (with slave feedback on), then preset/clear is generated from the slave feedback logic. All of this contributes to a low clock-to-Q propagation time for flip-flop 600.

The design of flip-flop 600 provides additional advantages. The low-capacitance devices used in the present invention typically have small size, which tends to decrease layout size. In additional, the use of only inverters for drivers, rather than gate structures as in flip-flop 500, implies a faster flip-flop with smaller layout and more symmetric drive capability.

In master-slave flip-flop 600 of FIG. 6, the devices that implement the gating function for the gated inverter structure in the master feedback path (i.e., MP1 and MN1) are connected between node i1 and the devices that implement the inverter function for that gated inverter structure (i.e., MP2 and MN2). Similarly, the devices that implement the gating function for the gated inverter structure in the slave feedback path (i.e., SP1 and SN1) are connected between node i3 and the devices that implement the inverter function for that gated inverter structure (i.e., SP2 and SN2). In alternative embodiments of the present invention, the gated inverter structure in either or both of the feedback paths can be reversed such that the inverter devices are connected between the corresponding node and the gating devices. In any case, in each of these different embodiments of the present invention, both the source and drain of one of the gating devices are not connected, respectively, to both the source and drain of the other gating device in the same feedback path.

In master-slave flip-flop 600, the preset and clear logic is part of the gated inverter structure in the feedback path of each of the master and slave stages. This need not be true for all embodiments of the present invention. In particular, the present invention covers master-slave flip-flops in which only the master slave or only the slave stage has a feedback path in which the preset and/or clear logic is part of a gated inverter structure in the feedback path, where the other stage is not so limited. In general, the other stage may or may not have a feedback path, it may or may not have a gated inverter structure in the feedback path, and it may or may not have preset and/or clear logic that may or may not be part of the feedback path, but, in any case, that other stage does not have preset and/or clear logic that is part of a gated inverter structure in the feedback path.

Although the present invention has been described in the context of master-slave flip-flops, which are a type of edge-triggered flip-flop, those skilled in the art will understand that the present invention can also be implemented in the context of level-sense flip-flops, often referred to as latches. A typical latch according to the present invention would have a single stage corresponding to everything to the left of node i2 in FIG. 6A, where node i2 becomes the latch output node Q. Alternative embodiments would include analogous latches supporting preset but not clear functionality as well as analogous latches supporting clear but not preset functionality.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated circuit having a flip-flop, the flip-flop comprising one or more stages, at least one stage having a transmission gate coupled to an input of a driver and a feedback path coupling an output of the driver to the input of the driver, wherein:

the feedback path comprises a gated inverter with either embedded preset logic or embedded clear logic or both;

the gated inverter comprises at least two devices that perform a gating function;

the devices that perform the gating function are not connected to each other at both their sources and their drains; and the devices that perform the gating function are connected between the input of the driver and devices that perform an inverter function in the gated inverter.

2. The invention of claim 1, wherein any embedded preset or clear logic in the feedback path is implemented using minimum size devices.

3. The invention of claim 2, wherein all devices in the feedback path are minimum size devices.

4. The invention of claim 3, wherein:

the driver is an inverter;

the addition of preset or clear logic to the at least one stage fails to affect either setup time or clock-to-Q propagation time; and the devices that perform the gating function are connected between the input of the driver and devices that perform an inverter function in the gated inverter.

5. The invention of claim 1, wherein the driver is an inverter.

6. The invention of claim 1, wherein the addition of preset or clear logic to the at least one stage fails to affect either setup time or clock-to-Q propagation time.

7. The invention of claim 1, wherein the flip-flop is a master-slave flip-flop, comprising:

(a) a master stage having a master transmission gate connected to a master driver with a master feedback path; and (b) a slave stage connected to the master stage, the slave stage having a slave transmission gate connected to a slave driver with a slave feedback path, wherein either the master feedback path or the slave feedback path or both comprise a gated inverter with either embedded preset logic or embedded clear logic or both.

8. The invention of claim 7, wherein each of the master and slave feedback paths comprises a gated inverter with either embedded preset logic or embedded clear logic or both.

9. The invention of claim 8, wherein each of the master and slave gated inverters has embedded preset and clear logic.

10. The invention of claim 7, wherein any embedded preset or clear logic in either the master or slave feedback path is implemented using minimum size devices.

11. The invention of claim 10, wherein all devices in the master and slave feedback paths are minimum size devices.

12. The invention of claim 7 wherein either the master driver or the slave driver or both are inverters.

13. The invention of claim 12, wherein both the master and slave drivers are inverters.

14. The invention of claim 7, wherein:

the addition of embedded preset or clear logic to the master stage fails to affect setup time; and the addition of embedded preset or clear logic to the slave stage fails to affect clock-to-Q propagation time.

15. The invention of claim 7, wherein clock signals used to control the slave stage are independent of any preset or clear signals.

16. The invention of claim 15, wherein clock signals used to control the master stage are dependent on either a preset signal or a clear signal or both.

17. The invention of claim 16, wherein:

each of the master and slave feedback paths comprises a gated inverter with either embedded preset logic or embedded clear logic or both;

any embedded preset or clear logic in either the master or slave feedback path is implemented using minimum size devices;

all devices in the master and slave feedback paths are minimum size devices;

both the master and slave drivers are inverters;

the addition of embedded preset or clear logic to the master stage fails to affect setup time; and the addition of embedded preset or clear logic to the slave stage fails to affect clock-to-Q propagation time.

18. An integrated circuit having a flip-flop, the flip-flop comprising one or more stages, at least one stage having a transmission gate coupled to an input of a driver and a feedback path coupling an output of the driver to the input of the driver, wherein:

the feedback path comprises a gated inverter with either embedded preset logic or embedded clear logic or both;

the gated inverter comprises at least two devices that perform a gating function;

the devices that perform the gating function are not connected to each other at both their sources and their drains;

the flip-flop is a master-slave flip-flop, comprising:

(a) a master stage having a master transmission gate connected to a master driver with a master feedback path; and (b) a slave stage connected to the master stage, the slave stage having a slave transmission gate connected to a slave driver with a slave feedback path, wherein each of the master and slave feedback paths comprises a gated inverter with either embedded preset logic or embedded clear logic or both.

19. The invention of claim 18, wherein each of the master and slave gated inverters has embedded preset and clear logic.

20. The invention of claim 18, wherein:

any embedded preset or clear logic in either the master or slave feedback path is implemented using minimum size devices;

all devices in the master and slave feedback paths are minimum size devices;

both the master and slave drivers are inverters;

the addition of embedded preset or clear logic to the master stage fails to affect setup time; and the addition of embedded preset or clear logic to the slave stage fails to affect clock-to-Q propagation time.

* * * * *